United States Patent
Hwang

Patent Number: 5,824,563
Date of Patent: Oct. 20, 1998

[54] METHOD FOR FORMING LOWER ELECTRODE OF CAPACITOR

[75] Inventor: Cheol-sung Hwang, Seongnam, Rep. of Korea

[73] Assignee: Samsung Electronics Co., Ltd., Suwon, Rep. of Korea

[21] Appl. No.: 560,087

[22] Filed: Nov. 17, 1995

[30] Foreign Application Priority Data

May 29, 1995 [KR] Rep. of Korea .................. 1995 13694

[51] Int. Cl.⁶ ........................ H01L 21/00; H01L 21/8242
[52] U.S. Cl. ................................. 438/3; 438/240
[58] Field of Search ................................. 437/47, 48, 52, 437/60, 919; 438/210, 3, 239, 240, 329, 396

[56] References Cited

U.S. PATENT DOCUMENTS

| | | | |
|---|---|---|---|
| 5,392,189 | 2/1995 | Fazan et al. | 361/305 |
| 5,407,855 | 4/1995 | Maniar et al. | 437/60 |
| 5,489,548 | 2/1996 | Nishioka et al. | 437/60 |

OTHER PUBLICATIONS

S. Wolf and R.N. Tauber, "Silicon Processing for the VLSI Era vol. 1—Process Technology," Lattice Press, pp. 335–336, 523, 528 & 541–542, 1986.

S. Wolf, "Silicon Processing for the VLSI Era vol. 2—Process Integration," Lattice Press, p. 230, 1990.

Primary Examiner—John Niebling
Assistant Examiner—Joni Y. Chang
Attorney, Agent, or Firm—Jones & Volentine, L.L.P.

[57] ABSTRACT

A method for forming the lower electrode of a capacitor used for fabricating a 1-Gbit or above DRAM, using a material having a high dielectric constant, is used in a method for manufacturing a storage capacitor of a VLSI semiconductor device. The lower electrode, which is to be in contact with a high dielectric film, is formed to have a triple-structured storage node pattern. The lowest layer of the lower electrode is formed with TiN which serves as a barrier against the diffusion of impurities from a lower substrate. The middle layer of the lower electrode is formed with $RuO_2$ which is easy to pattern. The uppermost layer of the lower electrode is formed with Pt which has excellent leakage current properties.

12 Claims, 4 Drawing Sheets

METHOD FOR FORMING LOWER ELECTRODE OF CAPACITOR

BACKGROUND OF THE INVENTION

The present invention relates to a method for manufacturing a storage capacitor of a very large scale integrated (VLSI) semiconductor device. More particularly, the present invention relates to a method for forming the lower electrode of a capacitor to be used for fabricating a 1 Gbit or above dynamic random access memory (DRAM).

As DRAM device densities increase to 64 Mbits and above, the types of capacitors used in these devices have changed and must continue to change to meet a growing need for smaller capacitors with relatively large capacitances. To meet this growing need, conventional capacitors using NO (nitride and oxide) thin films as their dielectric layers have been developed using planar structures, trench structures, stack structures, cylinder structures, and fin structures to increase available capacitance. Of these structures, cylinder and fin capacitor types are limited in terms of economy and reliability due to their extremely complex structures and intricate fabrication methods.

Studies on the use of high-dielectric thin films to overcome problems incurred from the complexity of the required capacitor structure have been ongoing in the United States and Japan for the past ten years. From these studies, perovskite-structured materials such as barium titanium oxide ($BaTiO_3$), lead titanium oxide ($PbTiO_3$), strontium titanium oxide ($SrTiO_3$, or more simply, STO), lead zirconium titanium oxide ($Pb(Zr,Ti)O_3$) and barium strontium titanium oxide (($Ba,Sr)TiO_3$, or more simply, BST) have attracted interest.

In particular, the very high dielectric constants of STO and BST materials (ranging from 300 to 600) make these materials appropriate for highly-integrated semiconductor capacitors. STO and BST materials allow for the simplification of capacitor processing in VLSI semiconductor device applications such as DRAMs of more than 1 Mbit by allowing the use of capacitors with a simpler physical design. Because of the high dielectric constant of the material used in the dielectric layer, these capacitors can employ simple designs yet still obtain a sufficiently large capacitance.

A study on the application of capacitors having STO thin films as their dielectric films to 64 Mbit DRAMs has recently been conducted, as shown in H. Yamaguchi et al., "Structural and Electrical Characterization of $SrTiO_3$ Thin Films Prepared by Metal Organic Chemical Vapor Deposition," Japan Journal of Applied Physics, Vol. 32, Part 1, No. 913, pp. 4069–4073, (1993). When using the above dielectric films having high dielectric constants, the general-purpose polysilicon used with conventional NO and $Ta_2O_5$ thin films cannot be used as an electrode material. This is attributed to the susceptibility of polysilicon to oxidation during a thin film deposition process or subsequent thermal process because of the presence of a high dielectric film. If a low dielectric oxide layer is formed at the interface between the electrodes and the dielectric layer capacitance rapidly decreases, thus negating the beneficial effects of the high dielectric material.

Accordingly, when fabricating a capacitor with a high dielectric material, a lower electrode, on which a dielectric film is deposited, must be formed of a material which can withstand thermal processing. A noble metal that resists oxidation, such as platinum (Pt), or an oxide material, such as ruthenium oxide ($RuO_2$), have so far been used for the lower electrode when fabricating a capacitor with a high dielectric material. Pt and $RuO_2$ have their own advantages and disadvantages for use in the lower electrode of a high dielectric capacitor.

As is generally known, Pt is difficult to pattern into a storage node since it is a chemically stable metal. Although the possibility of patterning Pt by means of a variety of gases is being explored, the problems of sidewall deposition of an etched object and low etch rate have yet to be solved.

$RuO_2$, in comparison, is easy to etch. However, the leakage current of an STO or BST film deposited on $RuO_2$ is about 100 times larger than if the same film were deposited on a Pt electrode. Despite its ease of etching, this large leakage current makes the use of $RuO_2$ unacceptable.

SUMMARY OF THE INVENTION

The object of the present invention is to provide a method for forming the lower electrode of a high dielectric capacitor which is easy to manufacture and is electrically improved by manufacturing a storage node applicable to a 1 Gbit DRAM, taking advantage of the low leakage current properties of Pt and easy patterning of $RuO_2$.

To achieve the above object, there is provided a method for manufacturing a high dielectric storage capacitor of a high integrated semiconductor device, which includes a lower electrode, a highly dielectric film and an upper electrode, comprising the steps of: forming a first layer of the lower electrode over a substrate, the first layer comprising a material that serves as a barrier against the diffusion of impurities from the substrate; forming a second layer of the lower electrode over the first layer, the second layer comprising a material that is easy to pattern; and forming a third layer of the lower electrode over the second layer, the third layer comprising a material having low leakage current properties.

In more detail, the method for manufacturing a capacitor of the present invention comprises the steps of: forming an insulating film on a semiconductor substrate; forming a contact hole in the insulating film; forming a polysilicon plug in the contact hole; depositing a first layer over the contact hole, the first layer comprising a material that serves as a barrier against the diffusion of impurities from the semiconductor substrate; depositing a second layer over the first layer, the second layer comprising a material that is easy to pattern; forming a hard mask pattern over the second layer; sequentially patterning the first and second layers; depositing a third layer over the patterned first and second, the third layer comprising a material having low leakage current properties; forming a dielectric layer on the third layer; and forming an upper electrode on the dielectric layer.

As a result of this manufacturing method there is provided a lower electrode of a capacitor in a semiconductor device, comprising a first layer comprising a material that serves as a barrier against the diffusion of impurities from a lower substrate; a second layer formed over the first layer, the second layer comprising a material that is easy to pattern; and a third layer formed over the second layer, the third layer comprising a material having low leakage current properties.

The first layer of the lower electrode preferably comprises TiN. The second layer of the lower electrode preferably comprises $RuO_2$. The third layer of the lower electrode preferably comprises Pt. The lower electrode, formed as a triple layer electrode, comprising the first, second, and third layers, is formed to be in contact with a dielectric layer. The dielectric layer is preferably a high-dielectric layer comprising a material from the group consisting of $SrTiO_3$ and $(Ba_xSr_{1-x})TiO_3$, and is preferably deposited by a CVD method.

The steps of depositing the first and second layers are preferably carried out through the use of a reactive DC sputtering process. The hard mask pattern preferably comprises silicon-on-glass (SOG) and the patterning step is preferably carried out through the use of a reactive ion etching method.

The step of depositing the third layer is performed by using a sputter method so that the third layer deposited over the top and sides of the first and second layers will have a variable thickness. The third layer, deposited over the top of the first and second layers is preferably approximately 200 Å thick.

The method for manufacturing a capacitor may further comprise a step of etching back the third layer to uniformly control the thickness of the third layer. When the third layer is overetched together with a portion of an interlayer insulating film formed below the third layer, this achieves complete isolation between node patterns during the step of etching back the third layer. The step of etching back the third layer is preferably controlled to maintain the thickness of the third layer on the top and sides of the node pattern at approximately 60 Å.

According to a preferred embodiment of the present invention, a capacitor having a triple-layered lower electrode (or a storage node pattern) of Pt, $RuO_2$ and TiN is formed by forming an $RuO_2$ and TiN node pattern using $RuO_2$ which is easy to pattern, and depositing Pt having low leakage current properties on the top of the node pattern which is to be in contact with a high dielectric film. Therefore, the capacitor can be of great use in Gbit-DRAM applications.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENT OF THE INVENTION

Figure 1:
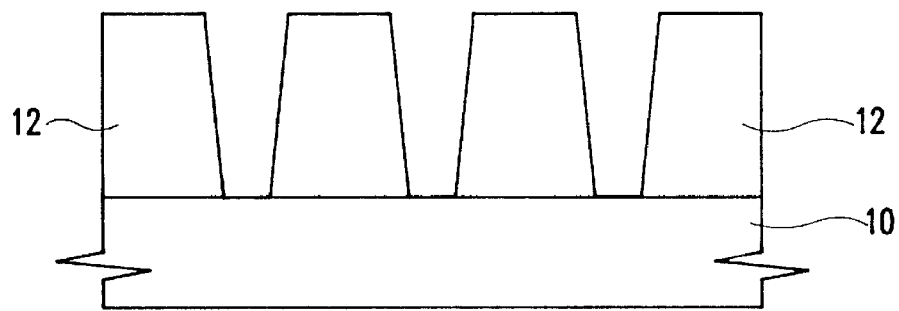
FIGS. 1 to 7 are cross-sectional views showing the steps in the formation of a capacitor lower electrode of a preferred embodiment of the present invention.

FIG. 1 shows a step of forming contact holes on a semiconductor substrate 10, preferably a silicon substrate, on which an interlayer insulating film 12 is formed. For example, the contact holes are formed using a predetermined mask pattern after depositing the interlayer insulating film 12 on the semiconductor substrate 10 on which a substructure (not shown) is formed. The interlayer insulating film 12 is formed of, e.g., borophosphorous silica glass (BPSG), using a chemical vapor deposition (CVD) method or $SiO_2$ obtained by thermal oxidation of silicon.

Figure 2:
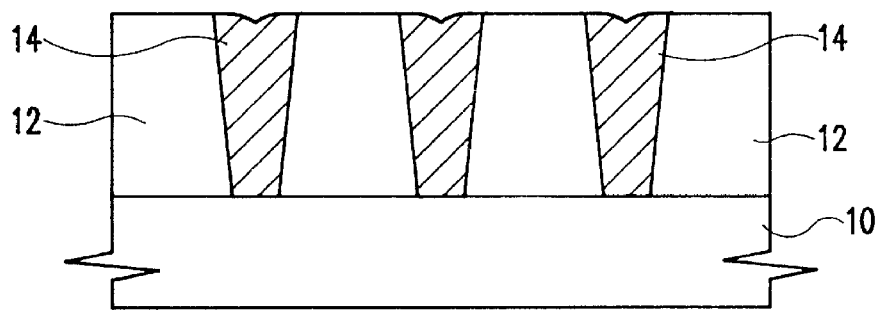

FIG. 2 shows the steps of forming polysilicon plugs 14 in the contact holes. In these steps, the polysilicon is coated on the resultant structure to sufficiently fill the contact holes and then is etched back to form the polysilicon plugs 14.

Figure 3:
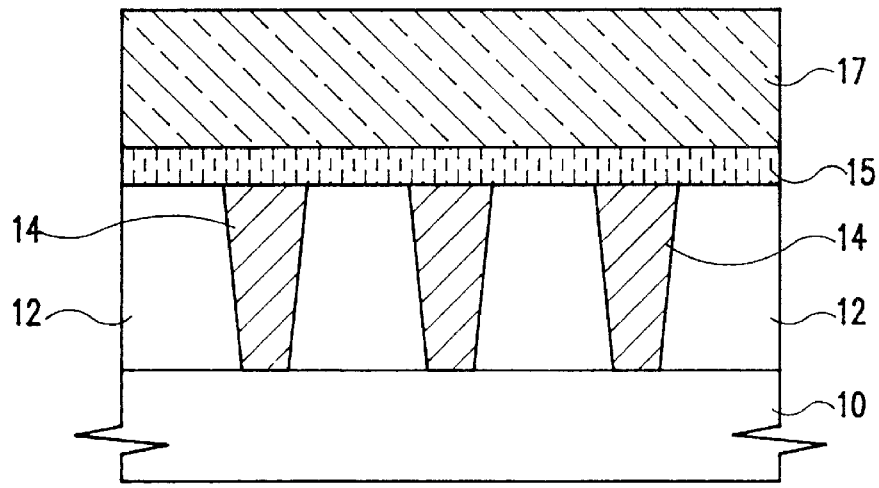

FIG. 3 shows the steps of sequentially depositing a barrier layer 15 and a patterning layer 17 on the whole surface of the resultant using a DC sputter method. The barrier layer is formed for the purpose of preventing the diffusion of silicon and impurities doped on conductive materials such as the semiconductor substrate 10 and the polysilicon plug 14 into the storage nodes. A metal nitride such as titanium nitride (TiN) is preferably used as a material for the barrier layer 15, although any suitable material that serves as a barrier against diffusion of impurities from the lower layers may be used. $RuO_2$ is preferably used for the patterning layer 17, although any suitable material that is easily patterned may be used.

Figure 4:
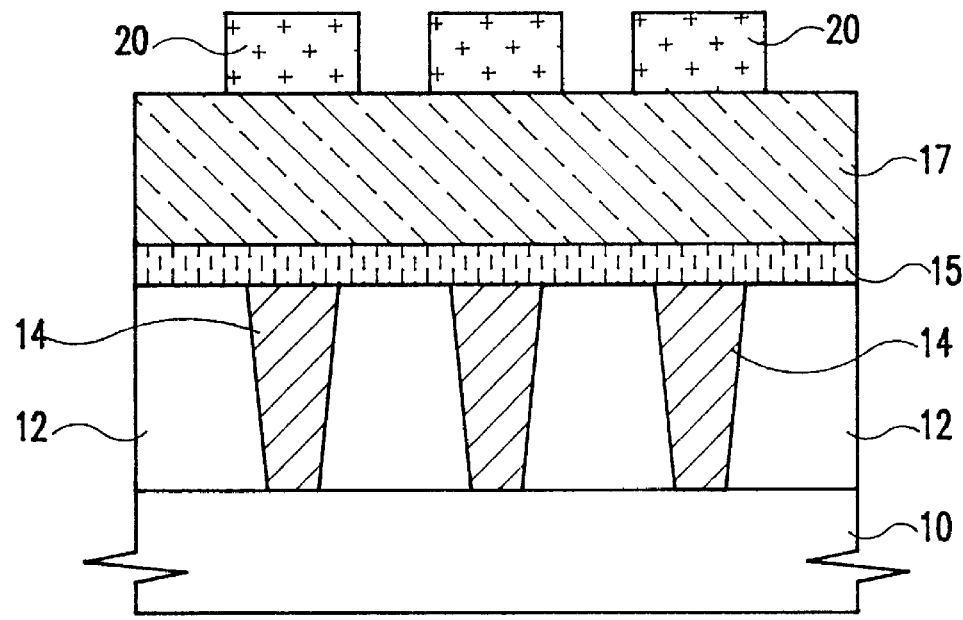

FIG. 4 shows a step of forming a mask pattern 20 for creating storage node patterns, each of which is separated in units of a cell by etching the barrier layer 15 and the patterning layer 17. The mask pattern 20 is preferably a SOG hard mask and includes shapes corresponding to the polysilicon plugs 14.

Figure 5:
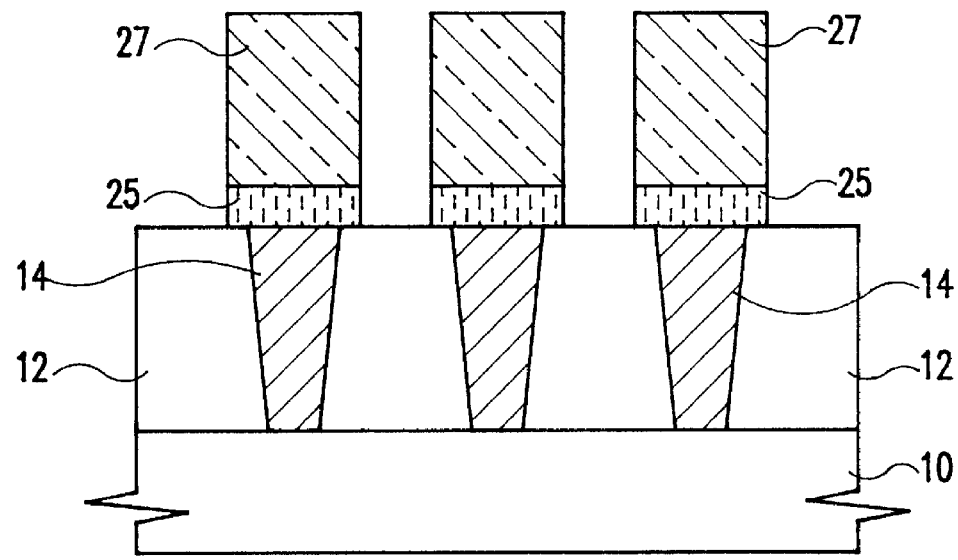

FIG. 5 shows a step of sequentially patterning the barrier layer 15 and the patterning layer 17, preferably through an RIE method using the mask pattern 20. The storage node patterns are formed by anisotropically etching the surface of the parts of the barrier layer 15 and the patterning layer 17 that are exposed by the mask pattern 20. After etching, the storage node patterns of the patterning layer 27 and the storage node patterns of the barrier layer 25 are formed. The RIE process in the preferred embodiment is performed by using $Cl_2$ gas to etch the TiN and a mixture of $Cl_2$ and $O_2$ gases to etch the $RuO_2$. If materials other than TiN and $RuO_2$ are used for the barrier layer 15 and the patterning layer 17, suitable etching gases should be chosen. After the etching step, the mask pattern 20 is removed, preferably using a fluoroform gas ($CHF_3$). As mentioned above, $RuO_2$ and TiN are easy to etch. Accordingly, they have a process margin sufficient for application to 1 Gbit-scale patterns.

Figure 6:
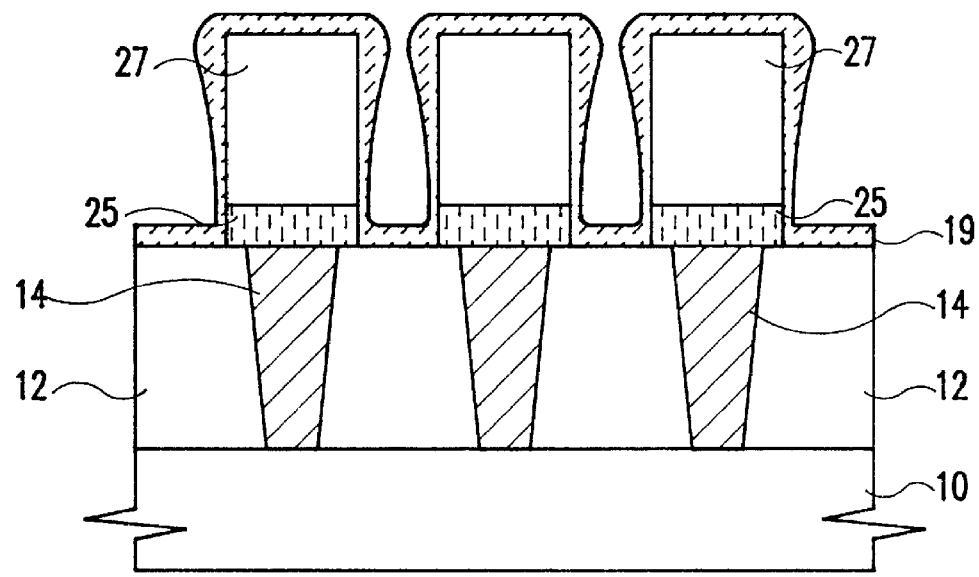

FIG. 6 shows a step of depositing a contact material, preferably Pt, on the storage node pattern of the patterning layer 27 and the storage node pattern of the barrier layer 25. A contact layer 19 is deposited on the top and sides of the barrier layer and patterning layer storage node patterns 25 and 27, and between these node patterns, through a sputtering process which leaves different thicknesses throughout the contact layer. The contact layer 19 preferably comprises a Pt thin film, although any suitable material having low leakage current properties may be used.

As noted above, the sputtering process produces poor step coverage. The sputtering method is used in the present invention to facilitate a later-described etch-back process in which horizontal etching is easy but vertical etching is difficult.

In the preferred embodiment it is desirable to control the Pt thin film contact layer 19 deposited on the tops of the node patterns to be approximately 200 Å thick. The reason for this is based on the following experiment, which is described with reference to FIG. 8.

Figure 8:
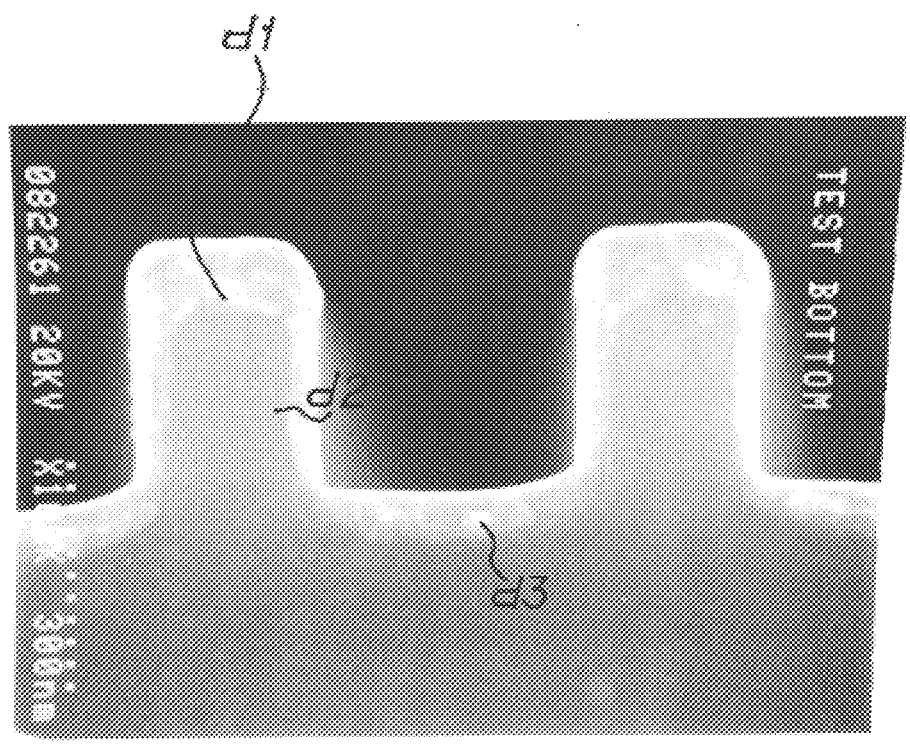
FIG. 8 is a cross-sectional photo showing the Pt thin film after the sputter deposition in a preferred embodiment of the present invention.

FIG. 8 shows a cross-sectional photo wherein Pt has been sputter-deposited over node patterns of $SiO_2$ instead of over $RuO_2$. For the DC sputtering, a DC power of 1.1 KW and an argon (Ar) atmosphere of 6 mTorr were used. Various thicknesses were then measured as follows. The thickness of the top of the deposited Pt was approximately 1100 Å. The thickness of the sides of the deposited Pt was about 300 Å. The thickness between patterns was about 700 Å.

The thickness of the super-thin film was determined to be 200 Å based on the sputter-deposition property and the experimental result. This particular thickness is selected so that the separating distance between storage nodes in a 1 Gbit DRAM is narrow, e.g., about 1500 Å, resulting in a limitation on the deposition thickness. Another reason is that when d1 is 200 Å, d2 and d3 will be deposited to a thickness of approximately 60 Å and 140 Å, respectively, and about 60 Å of Pt will remain on the top and sides by a subsequent etch-back process.

Figure 7:
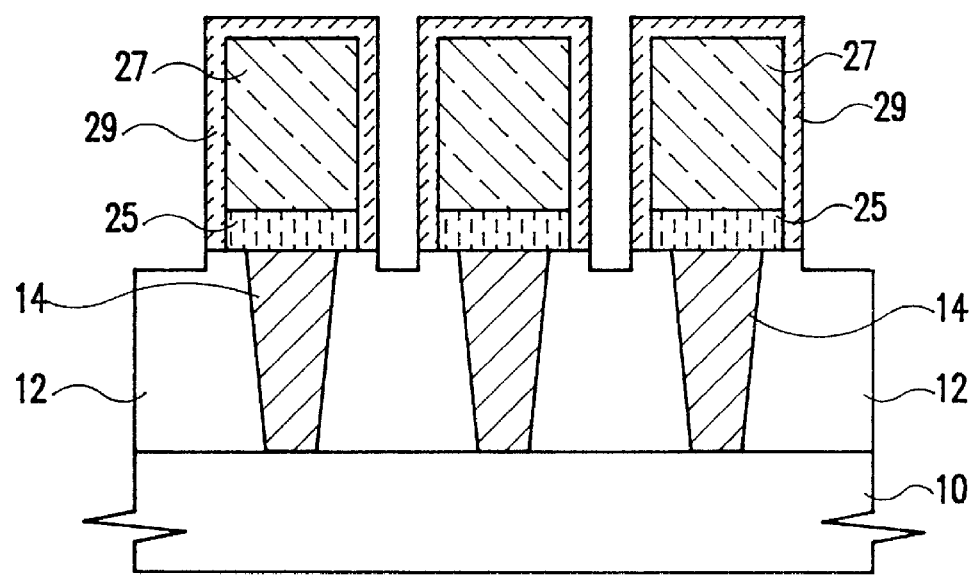

FIG. 7 shows an etch-back process for controlling the contact layer 19 to a uniform thickness. In the preferred embodiment, the Pt thin film contact layer 19 is sputter-deposited and electrically isolates the node patterns which are connected to one another. During the etch-back process, a mixture of Ar and $Cl_2$ gases are preferably used as a reactive gas for etching back of the contact layer 19. The process is controlled to form a contact thin film 29, a Pt thin film in the preferred embodiment, which remains on the top and sides of the node pattern at a thickness of about 60 Å. In the etch-back process of the preferred embodiment, the Pt deposited between the node patterns is preferably overetched, together with a portion of the interlayer insulating film 12 below the Pt layer, so that the nodes are entirely isolated from one another.

Through the above processes, the lower electrode of a high dielectric capacitor having a triple-layer is formed comprising a contact thin film 29, a patterning layer storage node pattern 27, and a barrier layer node pattern 25. The lowest layer of the triple-layer lowermost electrode, the barrier layer node pattern 25, is preferably formed of TiN or some other material that serves as a barrier against the diffusion of impurities from a lower substrate. The middle layer of the triple-layer lowermost electrode, the patterning layer node pattern 27, is preferably formed of $RuO_2$ or some other material that facilitates the production of fine patterns. The uppermost layer of the triple-layer lower electrode, the contact thin film 29 that is in contact with the high dielectric film, is preferably formed of Pt or some other material having low leakage current properties.

A formation step (not shown) of the high dielectric film on the contact thin film 29 is required for the creation of the desired capacitor. The dielectric film is formed on the upper layer 29 resultant, wherein the triple-layered lower electrode undergoes a deposition process of a dielectric material having a high dielectric constant such as STO. The deposition process is preferably performed by a metal organic CVD method at low temperature (about 450° C.) in an oxygen atmosphere, accompanied by a thermal process thereafter.

Finally, a capacitor which is suitable for the next generation Gbit-DRAMs is manufactured by performing a formation process of an upper electrode on the high dielectric film.

Figure 9:
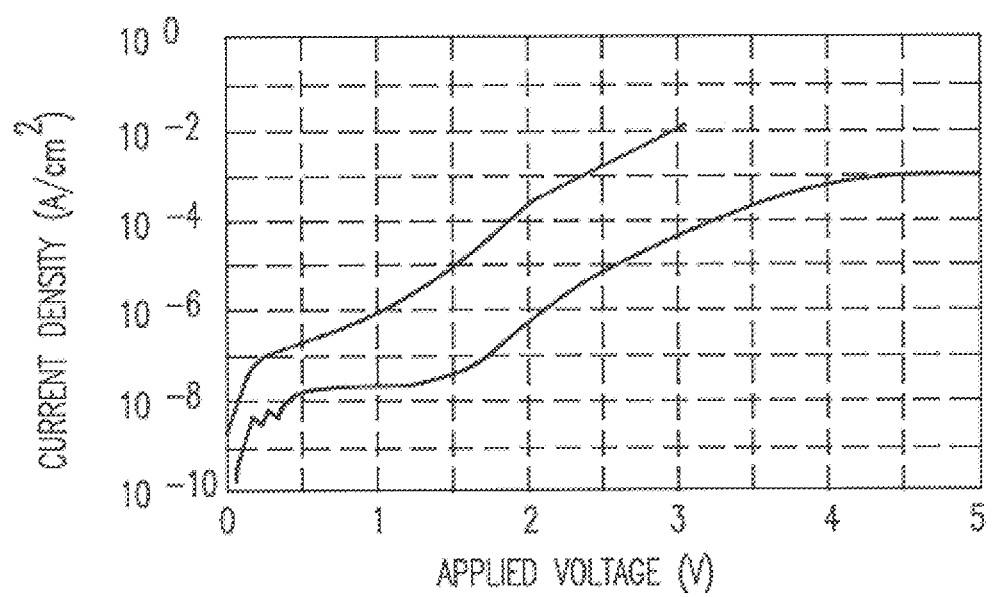
FIG. 9 is a graph showing current density vs. applied voltage for explaining the leakage current characteristics of a capacitor manufactured according to a preferred embodiment of the present invention.

The effects of the present invention will be more apparent by referring to FIG. 9, which illustrates J–V characteristic curves for explaining the leakage current property of the capacitor manufactured according to the present invention. The curves show the J–V characteristics of a conventional $RuO_2$ storage electrode and a storage electrode made of Pt, each of which has an STO dielectric film of 40 nm deposited thereon. As shown in the graph of FIG. 9, the leakage current of the Pt electrode case (the X-curve of the graph) at a voltage of 1.5V is about $5 \times 10^{-8}$ $A/cm^{-2}$ and that of conventional technology (the Y-curve of the graph) is about $1 \times 10^{-5}$ $A/cm^{-2}$. The capacitor of the present invention can thus achieve a leakage current about 200 times lower than that of the conventional technology.

As described above, in the high dielectric capacitor of the preferred embodiment of the present invention, a triple-layered lower electrode of Pt, $RuO_2$ and TiN can be created by forming an $RuO_2$ and TiN storage node pattern and depositing Pt having a low leakage current property on the top of the node pattern to be in contact with the high dielectric film.

As a result, a high dielectric capacitor which has a high process margin and excellent electrical properties can be obtained. The capacitor technology of the present invention can be of great use in 1 Gbit or greater DRAM applications.

The present invention is not limited to the above-described embodiments. Various changes and modifications may be effected by one having an ordinary skill in the art within the scope of the invention as, defined by the appended claims.

What is claimed is:

1. A method for manufacturing a capacitor, comprising the steps of:

forming a conductive plug in an insulating film formed on a semiconductor substrate, the conductive plug having a top surface, the top surface of the conductive plug being planar to a top surface of the insulating film;

forming a first layer over the conductive plug and the insulating film, the first layer serving as a barrier layer to prevent diffusion of impurities from the conductive plug and the semiconductor substrate;

forming a second layer over the first layer, the second layer comprising a material easier to pattern than Pt;

sequentially patterning the second layer and the first layer;

forming a third layer over the semiconductor substrate and the patterned second and first layers, the third layer comprising a material having lower leakage current properties than $RuO_2$, and etching back the third layer to form an isolated third layer in a cell unit, the isolated third layer being formed over the patterned first and second layers.

2. A method as recited in claim 1, wherein the first layer comprises TiN.

3. A method as recited in claim 1, wherein the second layer comprises $RuO_2$.

4. A method as recited in claim 1, wherein the third layer comprises Pt.

5. A method as recited in claim 1, wherein the steps of forming the first and second layers are performed by depositing the first and second layers by a reactive direct current sputtering process.

6. A method as recited in claim 1, wherein the step of sequentially patterning the second layer and the first layer is performed by reactive ion etching the second and first layers in sequence.

7. A method as recited in claim 1, wherein the step of sequentially patterning the second layer and the first layer is performed by etching the second and first layers using a mask pattern having a low etching selectivity with respect to the second layer.

8. A method as recited in claim 7, wherein the mask pattern comprises silicon-on-glass (SOG).

9. A method as recited in claim 1, wherein the step of forming a third layer is performed by sputtering a material having lower leakage current properties than $RuO_2$.

10. A method as recited in claim 1, wherein the step of etching back the third layer is followed by the steps of:

forming a high dielectric layer over the isolated third layer; and forming a conductive layer over the dielectric layer.

11. A method as recited in claim 10, wherein the step of forming a high dielectric layer comprises the step of depositing a high dielectric material selected from the group consisting of $SrTiO_3$ and $(Ba_xSr_{1-x})TiO_3$.

12. A method as recited in claim 10, wherein the step of forming a high dielectric layer comprises the step of chemically depositing a high dielectric material to form the high dielectric layer.

* * * * *